US007261180B1

(12) United States Patent
Faranda et al.

(10) Patent No.: US 7,261,180 B1
(45) Date of Patent: Aug. 28, 2007

(54) RIGGING SYSTEM FOR SPEAKER CABINETS

(76) Inventors: Anthony R Faranda, 4608 Cliff Dr., Erie, PA (US) 16511; Richard P Chase, 20060 Winton Run Rd., Corry, PA (US) 16407

( * ) Notice: Subject to any disclaimer, the term of this patent is extended or adjusted under 35 U.S.C. 154(b) by 210 days.

(21) Appl. No.: 11/123,601

(22) Filed: May 6, 2005

(51) Int. Cl.
*E04B 1/343* (2006.01)
*H05K 7/16* (2006.01)
*A47B 46/00* (2006.01)

(52) U.S. Cl. ........................ 181/199; 181/30; 181/144; 181/148; 181/198; 381/87; 381/335; 381/386; 248/220.21; 248/283.1; 248/274.1

(58) Field of Classification Search ................. 181/30, 181/144, 145, 199, 148; 381/87, 386, 335; 248/323, 324, 220.21, 282.1, 284.1, 283.1, 248/285.1, 276.1, 274.1
See application file for complete search history.

(56) References Cited

U.S. PATENT DOCUMENTS 3,163,064 A * 12/1964 Blackmon .................... 83/867
3,697,032 A * 10/1972 Pearce ..................... 248/188.4
3,958,786 A * 5/1976 Mann ...................... 248/176.3
4,772,077 A * 9/1988 Beam et al. ............... 312/9.25
4,779,832 A * 10/1988 Rees .......................... 248/421
5,098,053 A * 3/1992 Cotterill ................ 248/281.11
5,266,751 A * 11/1993 Taguchi ...................... 181/144
5,570,493 A * 11/1996 Gulick .......................... 27/18
5,613,662 A * 3/1997 Blackmore .................. 248/371
5,758,852 A * 6/1998 Martin .................... 248/282.1
5,819,959 A * 10/1998 Martin ....................... 211/118
5,898,977 A * 5/1999 Muir ........................... 16/363
6,536,554 B2 * 3/2003 Andrews et al. ............ 181/199
6,637,608 B1 * 10/2003 Schneider ................ 211/90.02
6,640,924 B2 * 11/2003 Messner ...................... 181/144
7,036,781 B1 * 5/2006 Bothe ...................... 248/291.1
2002/0071580 A1 * 6/2002 Engebretson et al. ....... 381/182
2003/0075656 A1 * 4/2003 Muir ....................... 248/276.1
2004/0052393 A1 * 3/2004 Bronson, III ............... 381/345
2004/0213425 A1 * 10/2004 Simidian et al. ............ 381/335
2005/0061937 A1 * 3/2005 Kim ........................ 248/274.1
2005/0201583 A1 * 9/2005 Colich ........................ 381/335

* cited by examiner

*Primary Examiner*—Lincoln Donovan
*Assistant Examiner*—Jeremy Luks
(74) *Attorney, Agent, or Firm*—Richard K Thomson

(57) ABSTRACT

A rigging system includes a lever arm permitting all speakers supported by the speaker whose rigging is adjusted to be angularly reoriented to focus the system, even out the coverage and fine tune the coverage. Multiple pivot attachment points for the moment arm are provided to enable an enhancement of the angular adjustment provided. A dozen or more angular positions can be provided for the lever arm to facilitate the trial-and-error method of optimizing the sound quality within the house.

12 Claims, 4 Drawing Sheets

RIGGING SYSTEM FOR SPEAKER CABINETS

BACKGROUND AND SUMMARY OF THE INVENTION

The present invention is directed to the field of sound systems. More particularly, the present invention is directed to a rigging system for forming speaker arrays which includes a lever arm which facilitates the movement of a portion of the array to improve sound quality of the sound system.

When sound systems are "built" in a large amphitheater or auditorium, the use of multiple speakers has the potential to create acoustical problems. Speaker arrays are focused to provide even coverage in the audience area and fine tune the sound distribution, avoiding bouncing the sound off the ceiling and walls. The sound will be focused, directed, toward the rear of house with lesser amounts of concentrated sound energy aimed at the front of the house, due to the audience's proximity to the speakers.

It is often the case that speakers are stacked 6, 8 or 12 or more, high. These stacks may be floor mounted or suspended from a ceiling bracket or mount. (Typically floor mounted stacks will not exceed 6 speakers, for safety reasons.) Use of spacers or shims is problematic, at best, and the need to move the speaker stack to accommodate such wedges increases the difficulty. Some rigging systems afford the ability to more easily adjust the angularity of adjacent speakers by relocating fasteners in the sides of the cabinet to permit tilting of one speaker relative to another. This is obviously a step up from the use of shims. However, the movement of a stack of speaker is still an issue; the stack, whether ground mounted or suspended, must be dismounted and laid down on its side to permit splay angles to be adjusted by pulling the securement pin and positioning it in an alternate hole. This is not just an operational headache. Movement of these stacks to lay them down and stand them up, present significant safety issues for the rig hands. Further, repeated adjustments necessary to focus the system and fine tune the coverage is made all the more difficult in the trial-and-error process.

The present invention seeks to address this problem. The rigging itself incorporates a lever arm which facilitates the pivotal movement of one or more speakers to readily permit focusing or re-aiming the system. The present invention comprises a rigging system for speaker cabinets in a stack comprising a) a generally rectangular bracket having means to attach the bracket to a side panel of a first one of the speaker cabinets; b) a rear tie bar pivotally attached to an upper, rear portion of the bracket with a first arm extending upwardly for attachment to a second adjacent speaker cabinet above the first speaker cabinet in the stack; c) a front tie bar pivotally attached to an upper, forward portion of the bracket with a second arm extending upwardly for attachment to the second adjacent speaker cabinet above the first speaker cabinet in the stack; d) a lever arm having a first upper end which can be secured to a number of different arcuately spaced positions on a forward portion of the bracket and a second lower end which is pivotally attached to a lower rear portion of the bracket at a first pivot point and attachable to said rear tie bar of a third adjacent speaker cabinet below the first cabinet in the stack at a second pivot point axially spaced from the first pivot point creating a moment arm such that when the lever arm is pivoted downwardly relative to said bracket from a first arcuately spaced position to a second arcuately spaced position, the moment arm enables the first speaker cabinet and all cabinets supported thereby to be rotated around a front edge by a first desired angular amount.

The rigging system employs both a first bracket for a first side as well as a second bracket attachable to a second side of the speaker cabinet. The bracket may more accurately be described as substantially trapezoidal. The first arm of the rear tie bar preferably has at least one additional pivot attachment point which adds angular adjustment when the second end of said lever arm is pivotally attached thereto. When the stack of speaker cabinets is suspended from a ceiling mount, all the cabinets supported by the first cabinet are those cabinets below the first speaker cabinet. When the stack of speaker cabinets is attached to a floor mount, all the cabinets supported by the first cabinet are those cabinets above the first speaker cabinet. It is an additional feature of the rigging system of the present invention that the front tie bar includes means to angularly adjust the position of the second speaker positioned above the first speaker cabinet to which it is attached.

Various other features, advantages and characteristics of the present invention will become apparent to one of ordinary skill in the art after a reading of the following specification.

BRIEF DESCRIPTION OF THE DRAWINGS

The preferred embodiment(s) of the present invention is/are described in conjunction with the associated drawings in which like features are indicated with like reference numerals and in which.

DETAILED DESCRIPTION OF PREFERRED EMBODIMENT(S)

Figure 1:
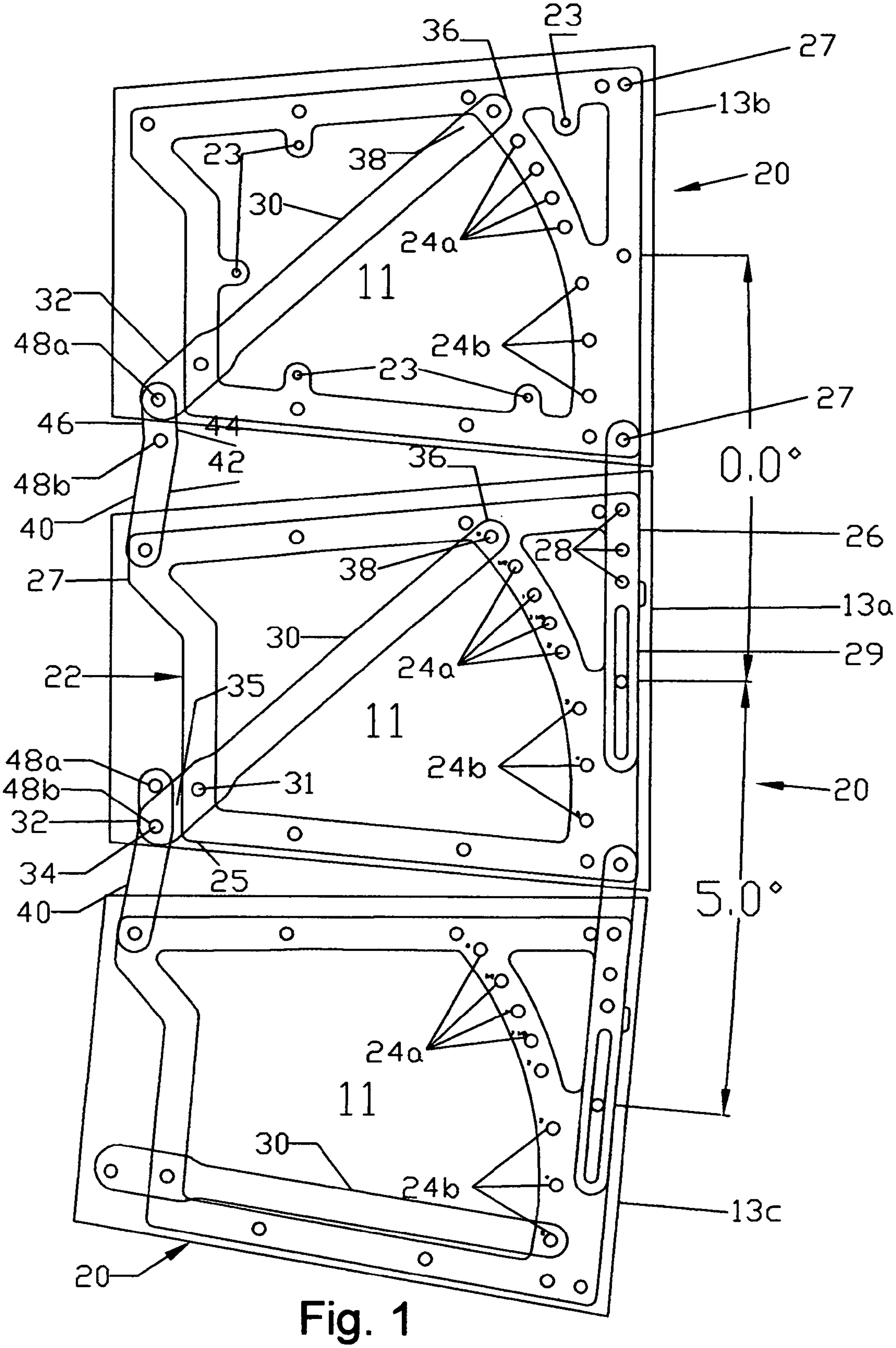
FIG. 1 is a side view of a first embodiment of the rigging system of the present shown utilized in a ceiling-suspended stack of three speakers invention.

A first embodiment of the rigging system for cabinets of the present invention is depicted in FIGS. 1-4 generally at 20. While speaker stacks will more typically extend from between 6 and 12 speakers, three cabinets, first cabinet **13*a*, second cabinet 13*b* and third cabinet 13*c*, are shown here for purposes of explanation. As best seen in FIG. 1, rigging system 20 includes a generally rectangular bracket 22 that is attachable to the side panel 11 of a first speaker cabinet 13*a* by inserting hardened cap screws (not shown) through holes 23. A second bracket (not shown) which is a mirror image of bracket 22 is attached to the opposite side of speaker cabinet 13*a*. When adjustments to rigging system 20 are discussed herein, it will understood that adjustment will be made to both brackets 22 on each side of a speaker 13**.

Bracket 22, which may actually more accurately be described as generally trapezoidal, has a plurality of arcuately spaced openings 24. Openings **24*a* are separated by angular amounts which result in a shift of speaker cabinets 13 of ½° while openings 24*b*** are spaced from adjacent openings by amounts resulting in a shift of 1°. It is contemplated that additional holes may be provided between holes 24*a* to provide the capability of finer adjustment such as, for example ¼°. Front tie bar 26 has a hole 27 in its upper end which is pivotally attachable to adjacent speaker cabinet 13*b*, a plurality of holes 28 and a slot 29 which permits angular adjustment of adjacent speaker cabinets 13 relative to one another. Holes 28 may be spaced, for example, by an amount providing 5° adjustment between speakers. Hole 27 will serve as the pivot point enabling the speaker 13*b* to effectively pivot about a lower front edge thereof. Since front pivot arms 26 are conventional, this description will focus primarily on the novel adjustment capabilities afforded by the lever arm 30 and rear tie bar 40.

Lever arm 30 has a lower end 32 which is pivotally attached to a lower rear portion 25 of bracket 22 at 31. Lower end 32 has a second hole 34 which may be pivotally attached to the rear tie bar 40 of adjacent third cabinet 13*c* positioned beneath first cabinet 13*a*. The offset between pivot point 31 and second hole 34 creates a moment arm 35 which enables the movement of lever arm 30 to displace the weight of the entire stack supported by the speaker whose rigging system 20 is being adjusted. Lever arm 30 has an upper end 36 having a hole 38 which can be selectively aligned with and pinned to any of the arcuately offset holes 24.

Rear tie bar 40 is pivotally mounted to a rear upper portion 27 of bracket 22 such that it can be attached to the lower end 32 of a lever arm 30 of a rigging system 20 on a second speaker 13*b* mounted above first speaker 13*a*. Rear tie bar 40 has a slight bend or dog leg 44 between first linear portion 42 and second shorter linear portion 46. In addition, rear tie bar 40 has at least two alternative pivot attachment points 48*a* and 48*b*. As seen in FIG. 1, when the second hole 34 of lever arm 30 is connected to attachment point 48*b*, the adjacent speaker 13*c* and all speakers supported thereby, are canted by an amount of 5° relative to the supporting speaker 13*a*. If the attachment point 48*a* is used, as indicated with speaker 13*b*, the face of the suspended speakers remain in plane with that of the supporting speaker. Adjusting lever arm 30 and pinning upper end 33 to one of the holes 24 allows added angularity to augment either the 0° placement using attachment point 48*a* or the 5°, when attachment point 48*b* is utilized by incremental amounts which depend on the arcuate spacing of holes 24 (depicted here as variously ½° and 1°, although other angles could be used). Lever arms 30 also function as levers enabling the pivoting of the speakers' weight about the fulcrum point provided by second hole 34 in lower end 32. This greatly facilitates the iterative process of eliminating sound wave interference: the speaker stack does not have to be removed from its mount and laid on its side. A simple removal and replacement of a pin adjusts the position of an entire group of speakers to a desired angle.

Figure 2:
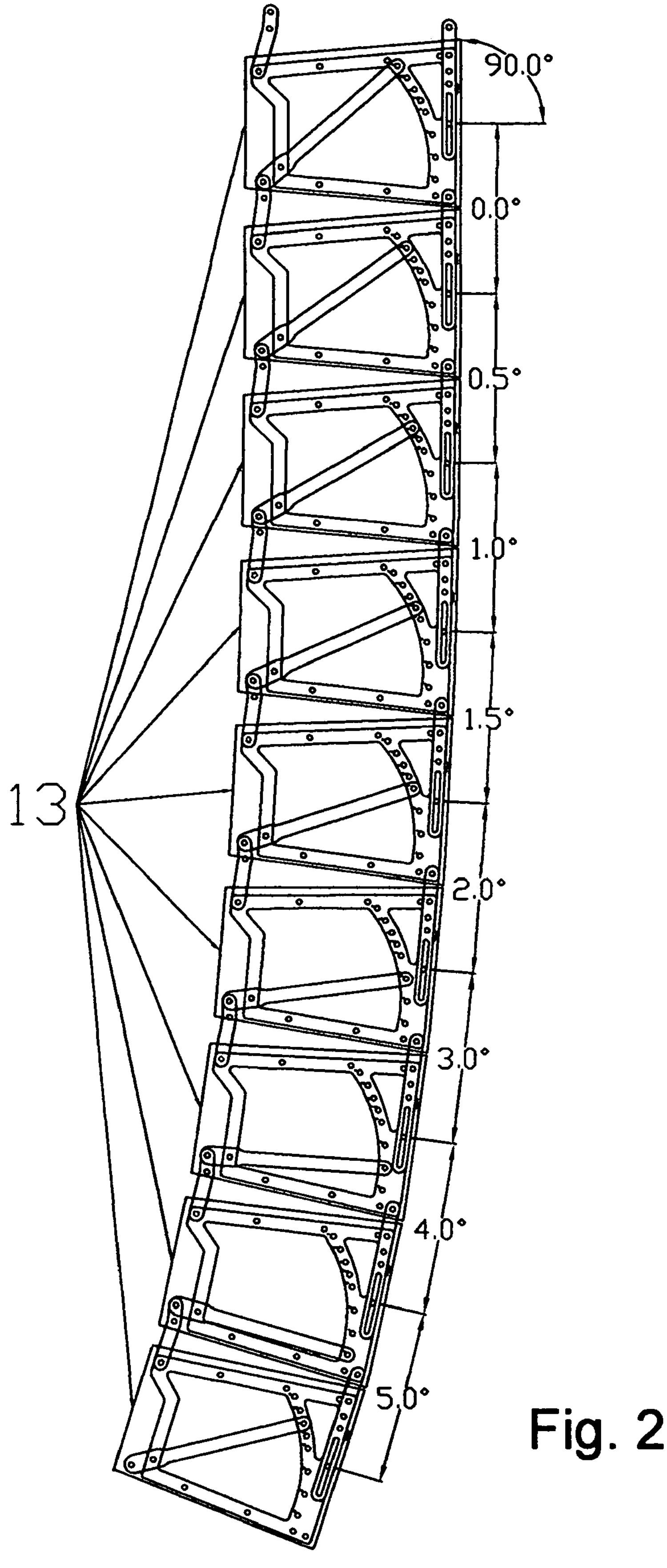
FIG. 2 is a side view of a first embodiment of the rigging system of the present shown utilized in a ceiling-suspended stack of nine speakers invention.
Figure 3:
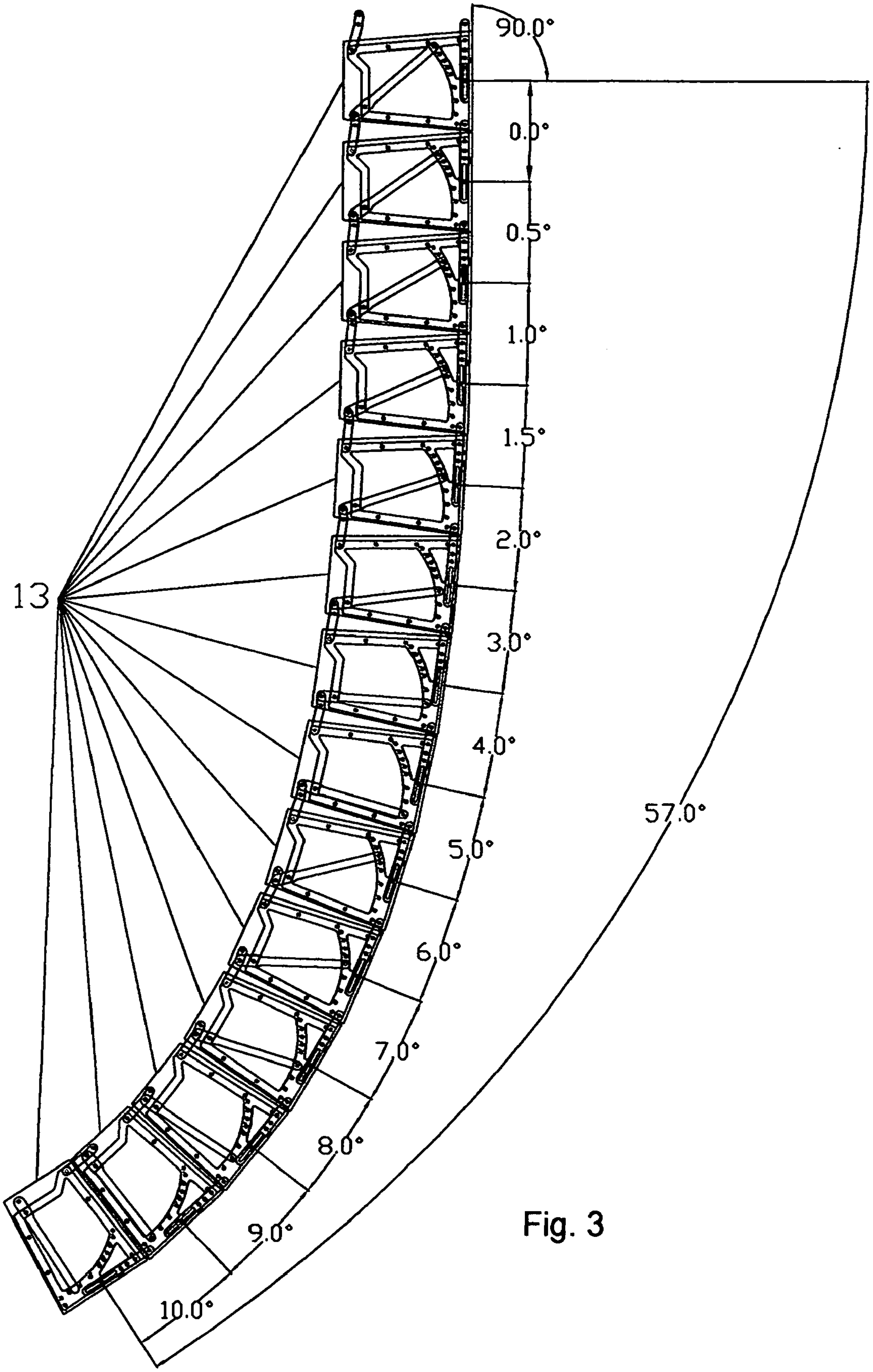
FIG. 3 is a side view of a first embodiment of the rigging system of the present shown utilized in a ceiling-suspended of fourteen speakers invention; and, FIG. 4 is a side view of the first embodiment employed with a floor mounted array.

As best seen in FIG. 2, the positioning of lever arm 30 permits 8 different orientations between adjacent speakers and, if additional holes are placed between the holes 24*a* as described above, these ¼° increments extend the variation to 12 different positions. As seen in FIG. 3, by using the alternate attachment point 48*b*, expand the maximum differential between speakers to 10°. The overall angularity of the 14 speaker array depicted there with each speaker's rigging being adjusted to a progressively increasing angle, is 57°. In the hanging speaker array, movement of the lever arm 30 adjusts the angular positions of all speakers 13 supported by the speaker whose rigging 20 is adjusted. In FIG. 1, the lowermost lever arm 30 is pinned in the lowermost hole 24 but, since a speaker is not supported thereby, this positioning results in no orientation adjustment.

Figure 4:
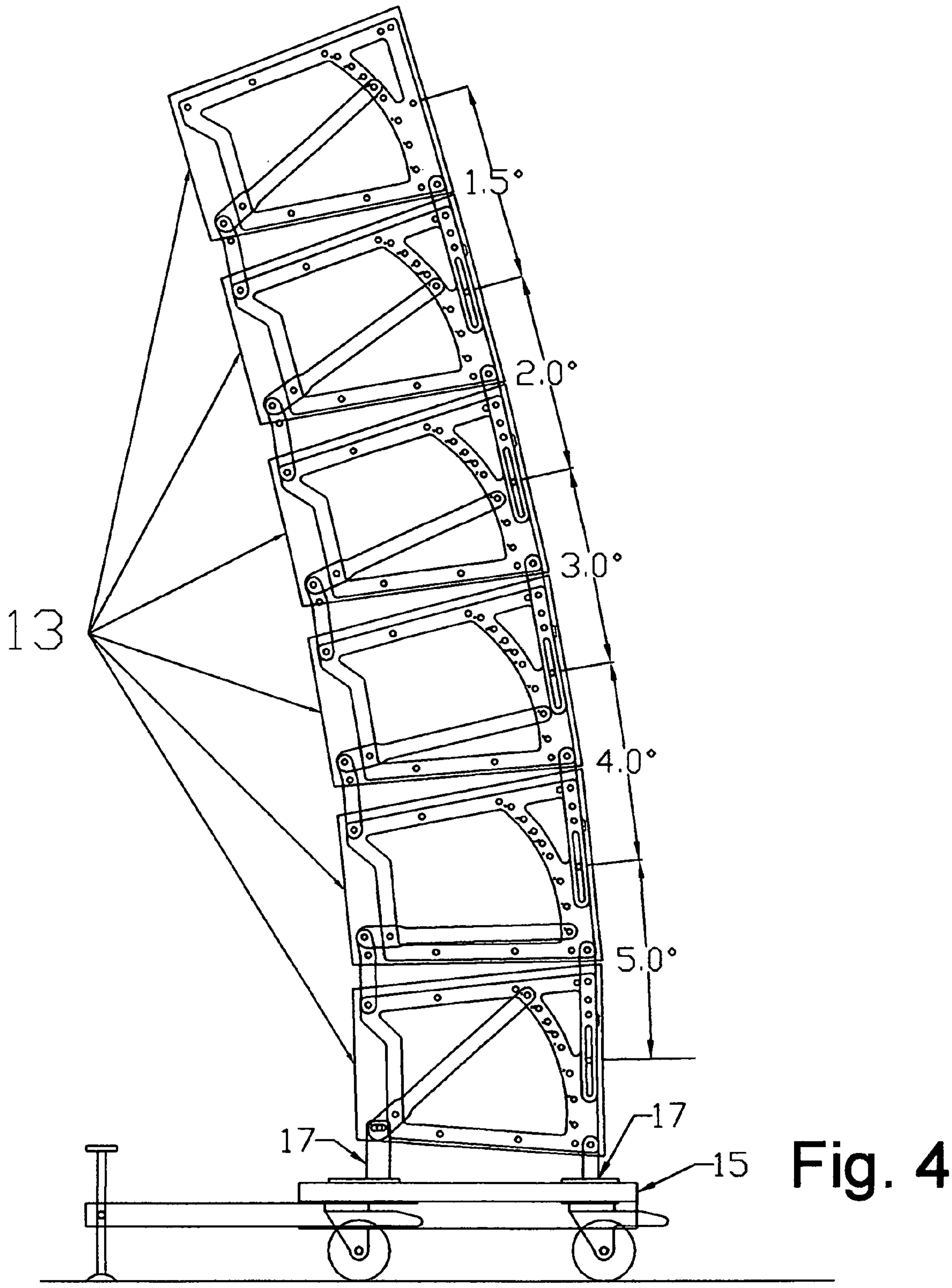

FIG. 4 depicts the rigging system 20 of the present invention being utilized with a floor mounted array. Speakers 13 are stacked on a trolley 15 which is secured in a desired position by anchor 17. It will be appreciated that in the floor mounted array of speakers 13, adjustment of the lever arm 30 results in displacement of all speakers supported by that speaker, which in the floor mount, includes the speaker 13 whose rigging system is adjusted. This is distinguished from the ceiling suspended array where the weight of the speaker whose rigging is adjusted is supported by the speaker 13 above it so, if adjustment of a particular speaker 13*a* (FIG. 1) is desired in the hanging array, the rigging system 20 of the speaker 13*b* above speaker 13*a* must be adjusted.

The rigging system 20 significantly enhances the ability of the sound engineer to make the necessary adjustment of speaker splay angles in a speaker stack to focus the system and fine tune the coverage. Lever arm 30 can be adjusted between holes 24 to provide the desired angular shift of speakers suspended by the rigging 20. If more than 5° adjustment is needed, lever arm 30 can be moved to attachment point 48*b* to add an additional 5° adjustment. All of these adjustments can be accomplished without the need to dismount the speaker stack from either a floor mount trolley or a ceiling suspension. This also means that the stack need not be laid down and stood back up, as is the case with other adjustable rigging systems.

Various changes, alternatives and modifications will become apparent to one of ordinary skill in the art following a reading of the foregoing specification. For example, it will be understood that the splay angles enumerated herein are merely exemplary and any such angles may be implemented without departing from the spirit of the invention. It is intended that any such changes, alternatives and modifications as fall within the scope of the appended claims be considered part of the present invention.

We claim:

1. A rigging system for speaker cabinets in a stack comprising a) a generally rectangular bracket having means to attach said bracket to a side panel of a first one of the speaker cabinets;

b) a rear tie bar pivotally attached to an upper, rear portion of said bracket with a first arm extending upwardly and includes a first pivot attachment point for attachment to a second adjacent speaker cabinet above said first speaker cabinet in the stack;

c) a front tie bar pivotally attached to an upper, forward portion of said bracket with a second arm extending upwardly for attachment to the second adjacent speaker cabinet above said first speaker cabinet in the stack;

d) a lever arm having a first upper end which can be secured to a number of different arcuately spaced positions on a forward portion of said bracket and a second lower end which is pivotally attached to a lower rear portion of said bracket at a first pivot point and attachable to said rear tie bar of a third adjacent speaker cabinet below said first cabinet in the stack at a second pivot point axially spaced from said first pivot point creating a moment arm, such that when said first upper end of said lever arm is pivoted downwardly relative to said bracket from a first arcuately spaced position to a second arcuately spaced position, said moment arm causes all cabinets supported by said first cabinet to be rotated around a front edge by a first desired angular amount.

2. The rigging system of claim 1 further comprising a second bracket attachable to a second side of the speaker cabinet.

3. The rigging system of claim 1 wherein said generally rectangular bracket is substantially trapezoidal.

4. The rigging system of claim 1 wherein said first arm of said rear tie bar has at least one additional pivot attachment point which adds angular adjustment when said second end of said lever arm is pivotally attached thereto.

5. The rigging system of claim 4 wherein said rear tie bar is dog-legged having a first linear portion and a second shorter linear portion angled relative to said first linear portion.

6. The rigging system of claim 5 wherein both said first pivot attachment point and said second pivot attachment point are mounted on said second shorter linear portion.

7. The rigging system of claim 1 wherein the stack of speaker cabinets is suspended from a ceiling mount and all the cabinets supported by the first cabinet are those cabinets below the first speaker cabinet.

8. The rigging system of claim 1 wherein the stack of speaker cabinets is attached to a floor mount and all the cabinets supported by the first cabinet are those cabinets above the first speaker cabinet.

9. The rigging system of claim 8 wherein pivotal movement of said lever arm moves said first cabinet of the stack attached to the floor mount.

10. The rigging system of claim 1 wherein said front tie bar includes means to angularly adjust the position of the second speaker positioned above the first speaker cabinet to which it is attached.

11. The rigging system of claim 1 wherein said arcuate positions on said forward portion of said bracket are spaced such that they produce angular movement of not greater than 1°.

12. The rigging system of claim 11 wherein at least some of said arcuate positions produce angular movement of ½°.

* * * * *